United States Patent
Sonoda et al.

[11] Patent Number: 6,100,579
[45] Date of Patent: Aug. 8, 2000

[54] INSULATING FILM FOR USE IN SEMICONDUCTOR DEVICE

[75] Inventors: Masahisa Sonoda; Susumu Shuto; Miwa Tanaka, all of Yokohama; Toshiaki Idaka, Yokosuka; Hiroaki Tsunoda; Hitoshi Araki, both of Yokohama, all of Japan

[73] Assignee: Kabushiki Kaisha Toshiba, Kawasaki, Japan

[21] Appl. No.: 08/983,010

[22] PCT Filed: Apr. 22, 1997

[86] PCT No.: PCT/JP97/01378

§ 371 Date: Jul. 2, 1998

§ 102(e) Date: Jul. 2, 1998

[87] PCT Pub. No.: WO97/40533

PCT Pub. Date: Oct. 30, 1997

[30] Foreign Application Priority Data

Apr. 23, 1996 [JP] Japan .................................. 8-100977

[51] Int. Cl.[7] .......................... H01L 23/58; H01L 21/469
[52] U.S. Cl. ............................ 257/632; 438/788; 438/792
[58] Field of Search .................................. 438/788, 792; 257/632, 640

[56] References Cited

U.S. PATENT DOCUMENTS

| | | | |
|---|---|---|---|
| 4,692,344 | 9/1987 | Kaganowicz et al. | 427/39 |
| 4,866,003 | 9/1989 | Yokoi et al. | 437/40 |
| 4,960,656 | 10/1990 | Chang et al. | 428/704 |
| 5,182,495 | 1/1993 | Fukuda et al. | 315/111.41 |
| 5,264,724 | 11/1993 | Brown et al. | 257/347 |
| 5,374,847 | 12/1994 | Araki et al. | 257/639 |
| 5,399,387 | 3/1995 | Law et al. | 427/574 |
| 5,483,097 | 1/1996 | Ohtsuki et al. | 257/632 |
| 5,624,864 | 4/1997 | Arita et al. | 437/3 |
| 5,877,095 | 3/1999 | Tamura et al. | 438/791 |

FOREIGN PATENT DOCUMENTS

| | | |
|---|---|---|
| 0 269 008 A2 | 6/1988 | European Pat. Off. . |
| 0 277 766 A2 | 8/1988 | European Pat. Off. . |

OTHER PUBLICATIONS

H. Araki et al., "High Reliability Passivation Film For EPROM", The Electrochemical Society 179th Meeting, (1994).

F. Atsuriro, "Semiconductor Device", Patent Abstracts of Japan, 014(546), (E–1008) (1990).

E. Sakagami et al., "The Impact of Intermetal Dielectric Layer and High Temperature Bake Test on the Reliability of Nonvolatile Memory Devices", IRPS, (1994).

*Primary Examiner*—Brian Dutton
*Attorney, Agent, or Firm*—Finnegan, Henderson, Farabow, Garrett & Dunner, L.L.P.

[57] ABSTRACT

In manufacturing a CVD film (interlayer insulating film or passivation film) using material gases containing a gas having Si—H combination, the amount of Si—H combination in the CVD film (12, 31, 32, 33, 34, 47, 48, 49, 57, 59) is set to $0.6 \times 10^{21} cm^{-3}$ or less to thereby suppress the formation of electron traps in the gate oxide film or tunnel oxide film and prevent variations in the threshold of transistors. In addition, the moisture resistance can be improved by setting the refractive index of the CVD film to 1.65 or more or by setting the concentration of nitrogen in the CVD film to $3 \times 10^{21} cm^{-3}$ or more.

28 Claims, 11 Drawing Sheets

INSULATING FILM FOR USE IN SEMICONDUCTOR DEVICE

TECHNICAL FIELD

The present invention relates to an insulating film which is deposited onto a semiconductor substrate by utilizing a chemical reaction of material gases containing a gas with Si(silicon)—H (hydrogen) combination.

BACKGROUND ART

The CVD (chemical vapor deposition) method is one of methods of forming an insulating film in the process of LSI manufacture. According to the CVD method, various insulating films can be formed on a semiconductor substrate by changing the kind of material gas.

Table 1 shows the relationship between material gases and insulating films (hereinafter referred to as CVD films) formed by means of the CVD method using the material gases.

TABLE 1

RELATION OF CVD FILM AND MATERIAL GASES

| CVD FILM | MATERIAL GASES |
|---|---|
| $SiO_2$ | { $SiH_4$, $SiHCl_3$, $SiH_2Cl_2$, $SiH_3Cl$, $SiCl_4$, $SiBr_4$, $SiF_4$, $Si(OC_2H_5)_4$ } + { $O_2$, NO, $NO_2$, $N_2O$, CO, $CO_2 + H_2$, $H_2O$ } |
| PSG | MATERIAL OF $SiO_2 + PH_3$ |
| BSG | MATERIAL OF $SiO_2 + B_2H_6$ |
| ASG | MATERIAL OF $SiO_2 + AsH_3$ |
| BPSG | MATERIAL OF BSG AND PSG $PO(OCH_3)_3$ |
| GSG | MATERIAL OF $SiO_2 + GeH_4$ |
| $Si_3N_4$ | { $SiH_4$, $SiHCl_3$, $SiH_2Cl_2$, $SiH_3Cl$, $SiCl_4$, $SiBr_4$ } + { $NH_3$, $N_2H_4$, $N_2$, $H_2$ } |
| $SiO_xN_y$ | MATERIAL OF $SiO_2$ + MATERIAL OF $Si_3N_4$ |
| $Al_2O_3$ | { $AlCl_3$, $Al(CH_3)_3$, $Al(C_2H_5)_3$, $Al(OC_3H_7)_3$ } + { $CO_2 + H_2$, $O_2$, $H_2O$ } |
| $TiO_2$ | $TiCl_4$ + { $CO_2 + H_2O$, $H_2O$ }; $Ti[(CH_3)_2CH—CH_2—O]_4$ |
| $Ta_2O_5$ | $TiCl_5$ + { $CO_2 + H_2$, $N_2O + H_2$ }; $TaCl_2(CO_2H_5)_2C_2H_7O_2$; $Ta(OC_2H_5)_5$ |

For LSI, $SiO_2$, PSG, ASG, BPSG, GSG, $Si_3N_4$ and SiOxNy are often used as interlayer insulating films and passivation films.

When a gas having Si—H combination (for example, $SiH_4$, $SiH_2Cl_2$, or the like) is used as a material gas in forming one of those films, the Si—H combination is formed partly in the resulting CVD film ($SiO_2$, SiOxNy, or the like).

H (hydrogen) contained in the CVD film is trapped in the gate oxide of transistors, the interface between the gate oxide film and the semiconductor substrate, and so on, causing variations in the threshold of the transistors and reducing the life of hot carriers.

It is therefore required that the CVD film contain as little hydrogen as possible.

As the CVD methods, there are known atmospheric pressure CVD, low pressure CVD, plasma CVD, and so on.

In the atmospheric pressure CVD and the low pressure CVD, since thermal energy causes a chemical reaction to take place, CVD film deposition is generally performed at a high temperature of 700° C. or more. In contrast, in the plasma CVD, CVD film deposition is performed by producing radicals of particles (atoms, molecules) in a plasma and causing a chemical reaction to take place between active particles, thus allowing the CVD deposition to take place at a low temperature of 250 to 400° C.

That is to say, insulating films formed by the plasma CVD (hereinafter referred to as P-CVD films) are often used as insulating films (interlayer insulating films and passivation films) on a metal interconnection layer made of aluminum or the like.

However, the CVD films (the P-CVD film in particular) have the following drawbacks:

a. Electron trap

H in CVD film is considered to reach the gate oxide film and tunnel oxide film ($SiO_2$) of a transistor and cut the combination between Si and O in the gate oxide film and tunnel oxide film during the formation of that film or in the process subsequent to the film formation.

And it is supposed that electrons are trapped at the combination cut sites and the trapped electrons have an adverse effect, such as variations in threshold, on transistors forming memory cells of a semiconductor memory (DRAM, SRAM, nonvolatile memory, or the like) and transistors making up logic.

b. Moisture resistance

Insulating films (passivation films in particular) for use with LSI are required to have a property of blocking moisture. This is because, when the moisture reaches metal interconnection lines made of metal, such as aluminum, it will corrode them.

When the plasma CVD is performed using, for example, $SiH_4$, $N_2O$, $N_2$ as material gases, an $SiO_2$ film is formed. However, it is known that the $SiO_2$ film is inferior in moisture resistance to an SiN film.

On the other hand, when the plasma CVD is performed using $SiH_4$, $NH_3$, $N_2$ as material gases, an SiN film is formed. The SiN film is very good in moisture resistance. However, since the SiN film contains a large amount of H (Si—H combination), it is known that a large number of electron traps are produced in the gate insulating film and the like.

The present invention is made to solve the drawbacks and its object is, first, to find such an amount of Si—H combination in a CVD film fabricated by material gases containing a gas having Si—H combination as permits variations in the threshold of transistors due to electron traps in the gate oxide film (or the tunnel oxide film) to remain unchanged from those in the case where there is no CVD film fabricated by material gases including a gas having Si—H combination and apply the result to semiconductor devices, and, second, to eliminate threshold variations due to electron traps in a CVD film fabricated by material gases including a gas having Si—H combination and improve the moisture resistance.

DISCLOSURE OF INVENTION

To attain the object, a semiconductor device of the present invention has an insulating film that is formed by means of CVD using material gases containing a gas having Si—H combination, and the amount of Si—H combination in the insulating film is $0.6 \times 10^{21} cm^{-3}$ or less.

The insulating layer is an interlayer insulating film or passivation film. The insulating film is placed at least on metal interconnection lines. The insulating film is one that is formed by means of plasma CVD.

The insulating film is one selected from an $SiO_2$ film, a PSG film, a BSG film, an ASG film, a BPSG film, a GSG film, an $Si_3N_4$, and an SiOxNy film.

The insulating layer should preferably be 1.65 or more in refractive index or $3 \times 10^{21} cm^{-3}$ or more in concentration of nitrogen.

A semiconductor device of the present invention has a passivation film and a wafer coated with the passivation film, the passivation film being formed by means of CVD using material gases containing a gas having Si—H combination, and the amount of Si—H combination in the passivation film being $0.6 \times 10^{21} cm^{-3}$ or less.

A semiconductor device of the present invention has a passivation film and a semiconductor chip coated with the passivation film, the passivation film being formed by means of CVD using material gases containing a gas having Si—H combination, and the amount of Si—H combination in the passivation film being $0.6 \times 10^{21} cm^{-3}$ or less.

The passivation film should preferably have a refractive index of 1.65 or more or a nitrogen concentration nitrogen of $3 \times 10^{21} cm^{-3}$ or more.

A memory device having a semiconductor substrate, memory cells formed on the semiconductor substrate, and an insulating film formed over the memory cells, the insulating film being formed by means of CVD using material gases containing a gas having Si—H combination, and the amount of Si—H combination in the insulating film being $0.6 \times 10^{21} cm^{-3}$ or less.

The insulating layer is an interlayer insulating film or passivation film. The insulating film is placed at least on metal interconnection lines. The insulating film is one that is formed by means of plasma CVD.

The insulating film is one selected from an $SiO_2$ film, a PSG film, a BSG film, an ASG film, a BPSG film, a GSG film, an $Si_3N_4$, and an SiOxNy film.

The memory cells are ones of a DRAM or EEPROM.

The insulating film should preferable have a refractive index of 1.65 or more or a nitrogen concentration of $3 \times 10^{21} cm^{-3}$ or more.

A semiconductor device of the present invention has a semiconductor substrate, MOS transistors formed on the semiconductor substrate, and an insulating film formed over the MOS transistors, the insulating film being formed by means of CVD using material gases containing a gas having Si—H combination, and the amount of Si—H combination in the insulating film being $0.6 \times 10^{21} cm^{-3}$ or less.

The insulating layer is an interlayer insulating film or passivation film. The insulating film is placed at least on metal interconnection lines. The insulating film is one that is formed by means of plasma CVD.

The insulating film is one selected from an $SiO_2$ film, a PSG film, a BSG film, an ASG film, a BPSG film, a GSG film, an $Si_3N_4$, and an SiOxNy film.

The insulating layer should preferably has a refractive index of 1.65 or more or a nitrogen concentration of $3 \times 10^{21} cm^{-3}$ or more.

A method of forming an insulating film of the present invention by means of CVD using material gases containing a gas having Si—H combination, the flow rate of the gas having Si—H combination is regulated so that the amount of Si—H combination in the insulating film becomes $0.6 \times 10^{21} cm^{-3}$.

A method of forming an insulating film of the present invention by means of CVD using material gases containing a gas having Si—H combination, the flow rate of a gas other than the gas having Si—H combination is regulated so that the amount of Si—H combination in the insulating film becomes $0.6 \times 10^{21} cm^{-3}$.

The insulating film is formed by means of plasma CVD.

BEST MODE OF CARRYING OUT THE INVENTION

Hereinafter, an insulating film and a method of manufacture thereof according to the present invention will be described with reference to the accompanying drawings.

Figure 1:
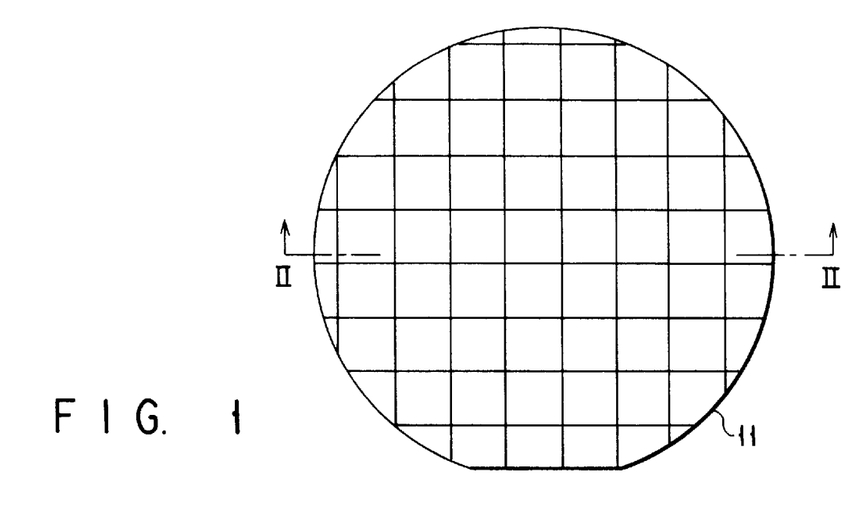
FIG. 1 is a plan view of a wafer coated with a passivation film of the present invention.
Figure 2:
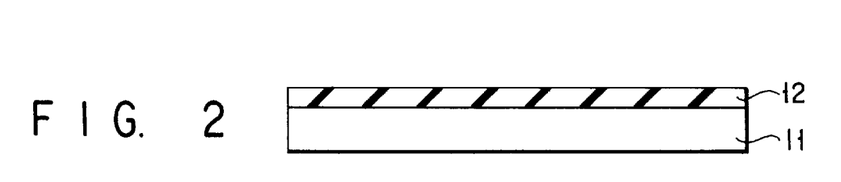
FIG. 2 is a sectional view taken along line II—II of FIG. 1.

FIG. 1 shows a semiconductor device according to a first embodiment using an insulating film of the present invention. FIG. 2 is a sectional view taken along line II—II of FIG. 1.

On a wafer 11 are formed components such as semiconductor memories, logic, etc. A passivation film 12 is formed to cover the major surface of the wafer 11.

The passivation film 12 is formed by means of CVD using material gases containing a gas having Si—H combination (for example, $SiH_4$, $S_2Cl_2$, or the like; see Table 1).

In this case, the amount of Si—H combination in the passivation film 12 is set to $0.6 \times 10^{21} cm^{-3}$ or below.

According to such a configuration, it is presumed that the amount of H that reaches the gate oxide film (or the tunnel oxide film) of transistors formed on the wafer 11 is reduced. The variations in the threshold of the transistors due to electron traps also remain unchanged from those in the case where the passivation film is formed by CVD using material gases with no Si—H combination.

CVD films using material gases with no Si—H combination include TEOS films fabricated using material gases containing an $Si(OC_2H_5)_4$ gas (see Table 1), and so on.

The passivation film 12 is generally formed by means of plasma CVD that permits film deposition to take place at low temperature. The reason is that, since metal lines, such as aluminum, are formed immediately below the passivation film 12, the film cannot be deposited at a temperature higher than the melting point of aluminum.

The P-CVD film formed by means of plasma CVD particularly contains much Si—H combination. Thus, the present invention is particularly effective for the passivation film 12 formed by means of plasma CVD using a gas containing Si—H combination.

The moisture resistance can be improved by setting the refractive index of the passivation film 12 to 1.65 or more and setting the concentration of nitrogen in the passivation film 12 to $3 \times 10^{21} cm^{-3}$ or more.

That is, the percent defective in a moisture resistance test when the refractive index of and the concentration of nitrogen in the passivation film 12 satisfy those conditions is 0%.

Figure 3:
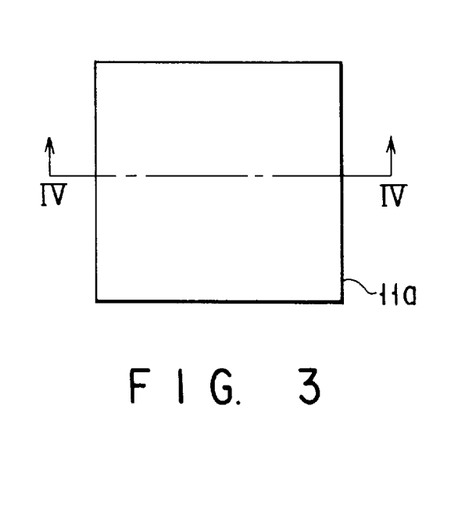
FIG. 3 is a plan view of a chip coated with a passivation film of the present invention.
Figure 4:
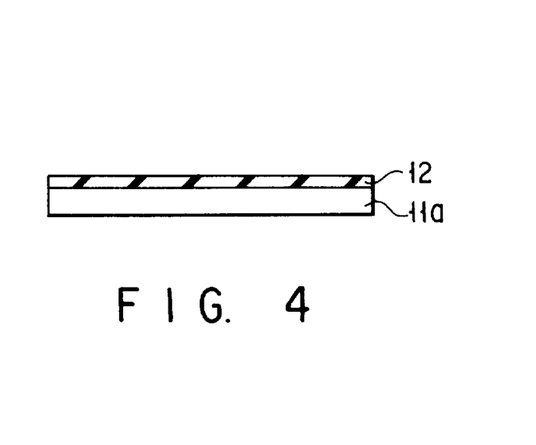
FIG. 4 is a sectional view taken along line IV—IV of FIG. 3.

FIG. 3 shows a semiconductor device according to a second embodiment using an insulating film of the present invention. FIG. 4 is a sectional view taken along line IV—IV of FIG. 2.

On a chip 11a there are formed components such as a semiconductor memory, logic, etc. The chip 11a is sliced from a wafer by the dicing process. The passivation film 112 is formed to cover the major surface of the chip 11a.

The passivation film 12 is formed by means of CVD using material gases containing a gas having Si—H combination (for example, $SiH_4$, $S_2Cl_2$, or the like; see Table 1).

In this case, the amount of Si—H combination in the passivation film 12 is set to $0.6 \times 10^{21} cm^{-3}$ or below.

According to such a configuration, it is presumed that the amount of H in the passivation film 31 that reaches the gate oxide film (or the tunnel oxide film) of transistors formed on the chip 11a is reduced. The variations in the threshold of the transistors due to electron traps remain unchanged from those in the case where the passivation film is formed by CVD using material gases with no Si—H combination.

CVD films formed using material gases with no Si—H combination include TEOS films fabricated using material gases containing an $Si(OC_2H_5)_4$ gas (see Table 1), etc.

The passivation film 12 is generally formed by means of plasma CVD that permits film deposition to take place at low temperature. The reason is that, since metal lines, such as aluminum, are formed immediately below the passivation film 12, the film cannot be deposited at a temperature higher than the melting point of aluminum.

The P-CVD film formed by means of plasma CVD particularly contains much Si—H combination. Thus, the present invention is particularly effective for the passivation film 12 formed by means of plasma CVD using a gas containing Si—H combination.

The moisture resistance can be improved by setting the refractive index of the passivation film 12 to 1.65 or more and setting the concentration of nitrogen in the passivation film 12 to $3 \times 10^{21} cm^{-3}$ or more. The percent defective in a moisture resistance test when the refractive index of and the concentration of nitrogen in the passivation film 12 satisfy those conditions is 0%.

Figure 5:
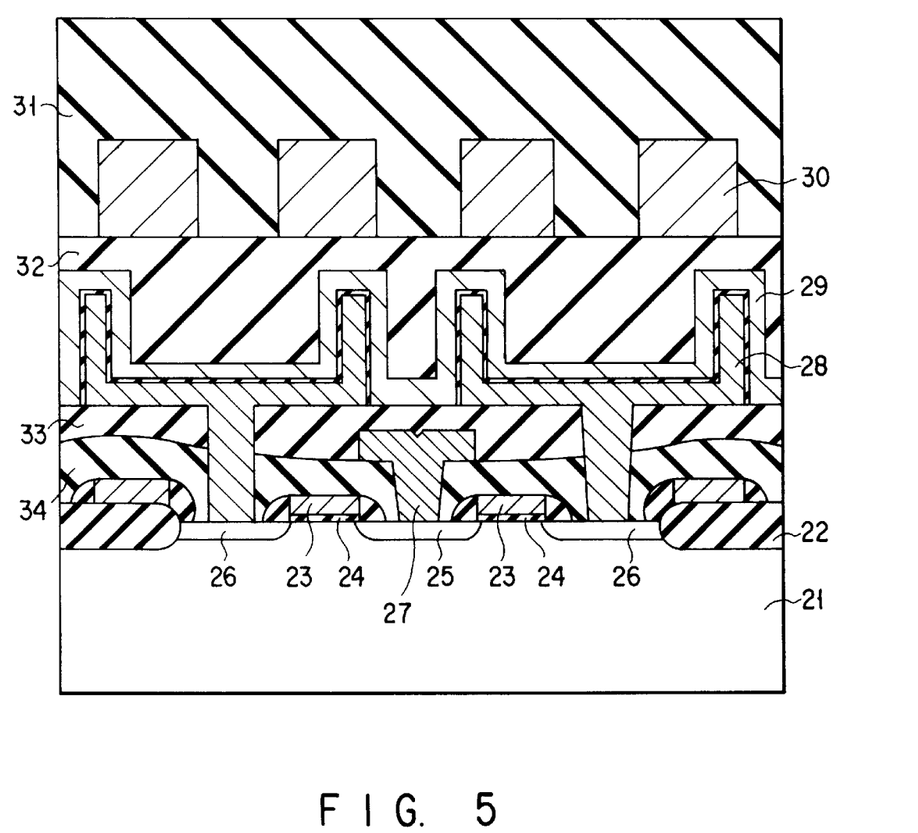
FIG. 5 a sectional view of an exemplary DRAM having an insulating film of the present invention.

FIG. 5 shows a semiconductor device according to a third embodiment using an insulating film of the present invention. In this embodiment, the insulating film of the present invention is applied to a dynamic random access memory (DRAM).

On a semiconductor substrate 21 is formed a field oxide film 22. In a device region surrounded with the field oxide film 22 are formed memory cells, each of which consists of a gate electrode 23, a drain region 25, and a source region 26.

A bit line 27 is connected with the drain region 25. One capacitor electrode (storage node) 28 is connected with the source region 26. The other capacitor electrode (plate electrode) 29 is placed over the capacitor electrode 28 with a capacitor insulating film interposed therebetween.

Metal lines 30 made of aluminum or the like are formed on the top layer of the structure.

Here, a passivation film 31 to cover the metal lines 30 is formed by means of CVD using material gases containing a gas having Si—H combination (for example, $SiH_4$, $SiH_2Cl_2$, or the like; see Table 1).

In this case, the amount of Si—H combination in the passivation film 31 is set to $0.6 \times 10^{21} cm^{-3}$ or less.

For interlayer insulating films 32, 33 and 34 as well, the amount of Si—H combination in those films is set to $0.6 \times 10^{21} cm^{-3}$ or less if they are formed by means of CVD using material gases containing a gas with Si—H combination.

The passivation film 31 is generally formed by means of plasma CVD that permits a film to be deposited at low temperature. The interlayer insulating films 32, 33 and 34 are formed by means of atmospheric pressure CVD, low pressure CVD, or plasma CVD.

According to such a configuration, it is presumed that the amount of H in the passivation film 31 that reaches the gate oxide film ($SiO_2$) 24 of memory cell transistors is reduced. The frequency that the combination of Si and O in the gate oxide film 24 is cut is also expected to become reduced.

Since the frequency that the combination of Si and O in the gate oxide film 24 is cut is reduced, the variations in the threshold of the transistors due to electron traps in the gate oxide film 24 remain unchanged from those in the case where the passivation film or interlayer insulating layer is formed by means of CVD using material gases with no Si—H combination.

The moisture resistance of the passivation film 31 can be improved by setting the refractive index of the passivation film 31 to 1.65 or more or setting the concentration of nitrogen in the passivation film 31 to $3 \times 10^{21} cm^{-3}$ or more.

That is, the percent defective in a moisture resistance test when the refractive index of and the concentration of nitrogen in the passivation film 31 satisfy those conditions is 0%.

Figure 6:
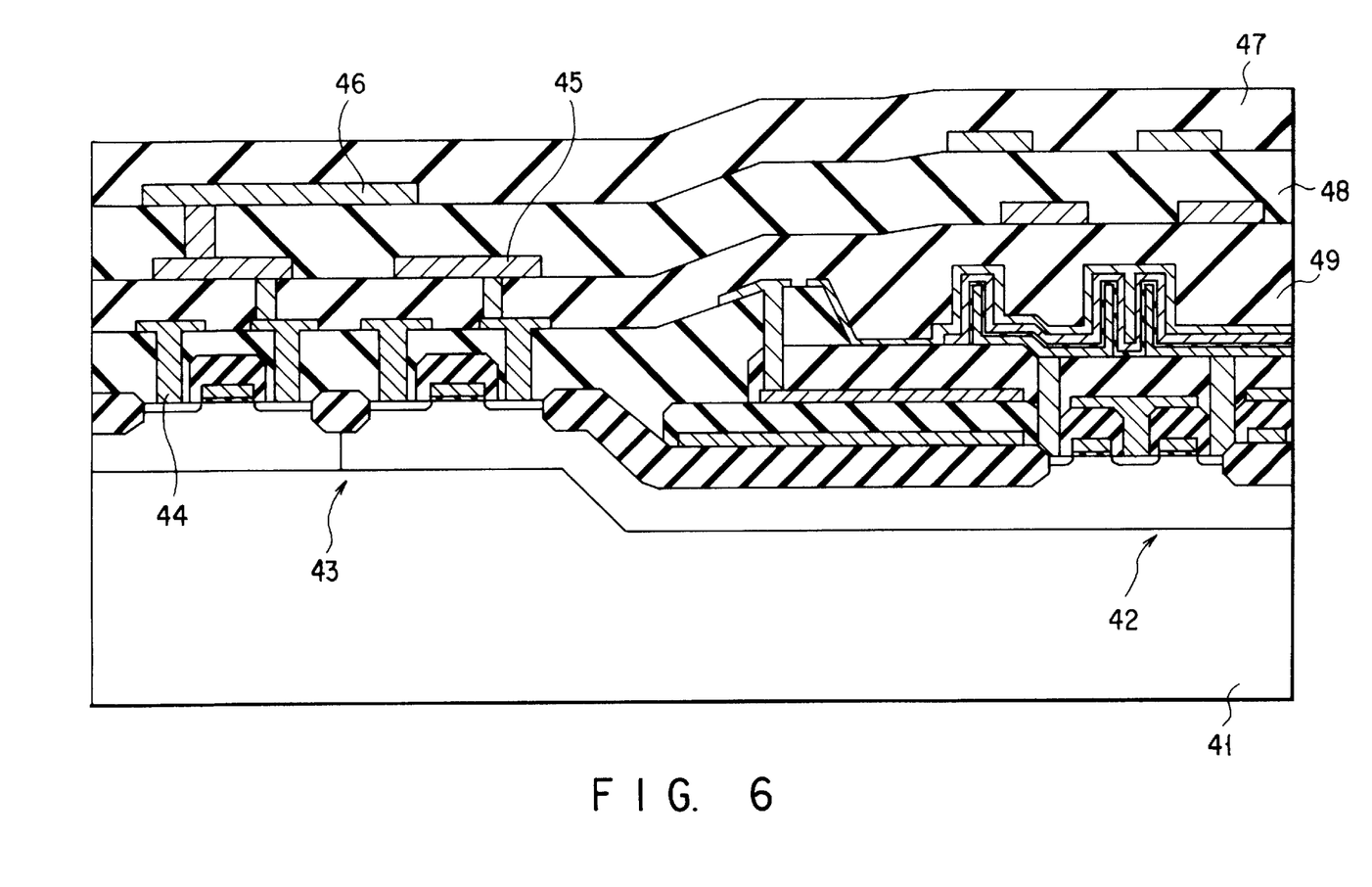
FIG. 6 is a sectional view of an example of a DRAM having an insulating film of the present invention.

FIG. 6 shows a semiconductor device according to a fourth embodiment using an insulating film of the present invention. In this embodiment, the insulating layer of the present invention is applied to a dynamic random access memory (DRAM).

On a semiconductor substrate 41 are formed memory cells 42 and a peripheral circuit 43 placed on the periphery of the memory cells 42.

First level metal lines 44 (for example, aluminum) are connected to the source region and the drain region of each MOS transistor comprising the peripheral circuit 43. An interlayer insulating layer 49 is formed to cover the first level metal lines 44.

Second level metal lines (for example, aluminum) 45 are formed on the interlayer insulating film 49. An interlayer insulating film 48 is formed to cover the second level metal lines 45.

Third level metal lines (for example, aluminum) 46 are formed on the interlayer insulating film 48. A passivation film 47 is formed to cover the third level metal lines 46.

The passivation film 47 and the interlayer insulating films 48 and 49 are formed by means of CVD using material gases containing a gas with Si—H combination (for example, $SiH_4$, $SiH_2Cl_2$, or the like; see Table 1).

In this case, the amount of Si—H combination in the passivation film 47 and the interlayer insulating films 48 and 49 is set to $0.6 \times 10^{21} cm^{-3}$ or less.

The passivation film 31 and the interlayer insulating films 48 and 49 are generally formed by means of plasma CVD that permits a film to be deposited at low temperature because the metal lines are formed immediately below them.

According to such a configuration, it is presumed that the amount of H in the passivation film 47 and the interlayer insulating films 48 and 49 that reaches the gate oxide film ($SiO_2$) 24 of each memory cell transistors and the gate oxide film of each transistor comprising the peripheral circuit is reduced. The frequency that the combination of Si and O in the gate oxide film is cut will also become reduced.

Since the frequency that the combination of Si and O in the gate oxide film is cut is reduced, the variations in the threshold of the transistors due to electron traps in the gate oxide film remain unchanged from those in the case where the passivation film or interlayer insulating layer is formed by means of CVD using material gases with no Si—H combination.

The moisture resistance of the passivation film 47 and the interlayer insulating films 48 and 49 can be improved by setting the refractive index of the passivation film 47 and the interlayer insulating films 48 and 49 to 1.65 or more or setting the concentration of nitrogen in the passivation film 47 and the interlayer insulating films 48 and 49 to $3 \times 10^{21} cm^{-3}$ or more.

That is, the percent defective in the moisture resistance test when the refractive index of or the concentration of nitrogen in the passivation film 31 satisfies the condition is 0%.

Figure 7:
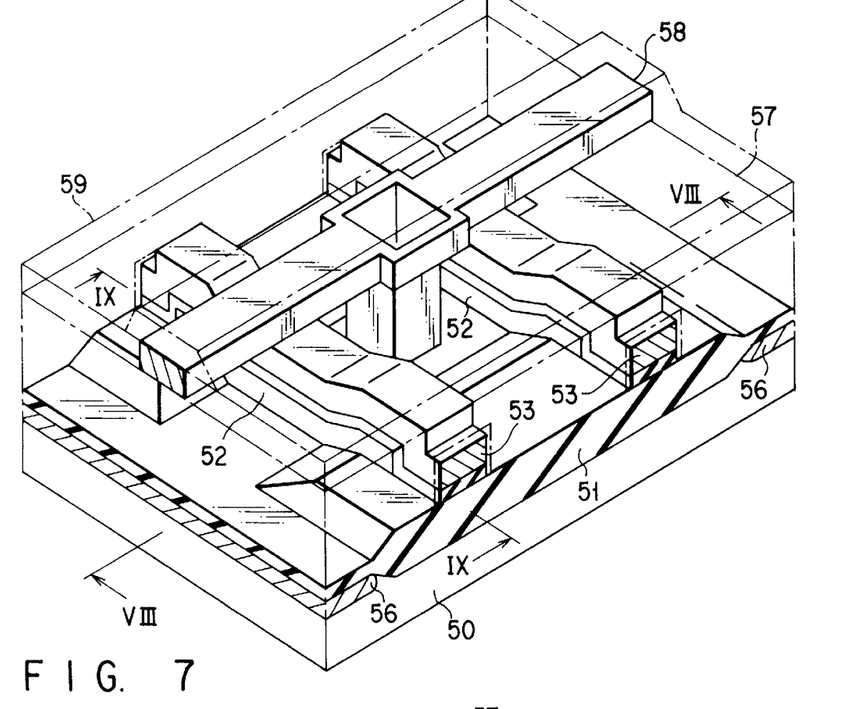
FIG. 7 is a perspective view of an example of an EEROM having an insulating film of the present invention.
Figure 8:
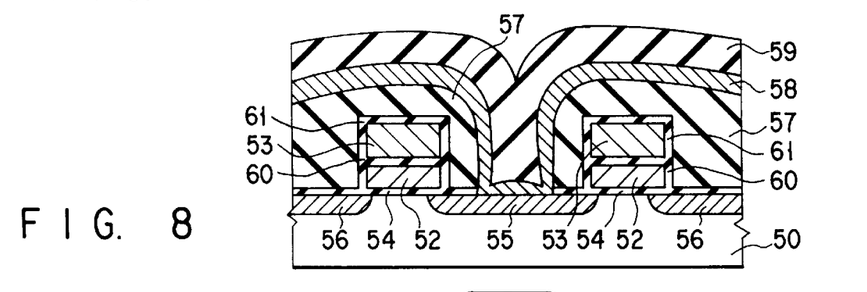
FIG. 8 is a sectional view taken along line VIII—VIII of FIG. 7.
Figure 9:
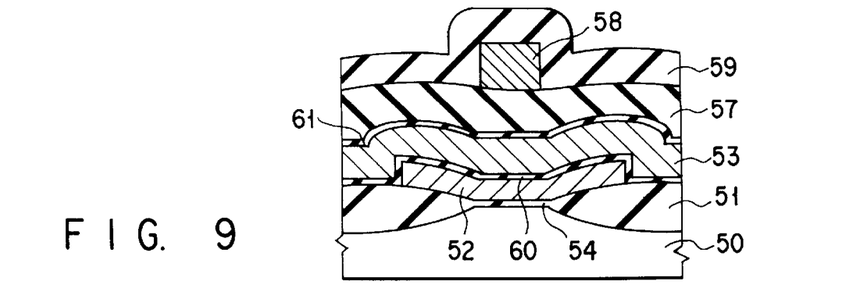
FIG. 9 is a sectional view taken along line IX—IX of FIG. 7.

FIG. 7 shows a semiconductor device according to a fourth embodiment using an insulating film of the present invention. FIG. 8 is sectional view taken along line VIII—VIII of FIG. 7, and FIG. 9 is a sectional view taken along line IX—IX of FIG. 7.

In this embodiment, the insulating film of the present invention is applied to an EEPROM.

A field oxide film 51 is formed on a semiconductor substrate 50. In a device region surrounded with the field oxide film 51, a memory cell is formed, which consists of a floating gate electrode 52, a control gate electrode 53, a drain region 55, and a source region 56.

A BPSG film 57 is formed to coat the memory cell. The amount of Si—H combination in the BPSG film is set to $0.6 \times 10^{21} cm^{-3}$ or less if it is formed by means of CVD using material gases containing a gas with Si—H combination (for example, SiH4, $SiH_2Cl_2$, or the like; see Table 1).

A bit line 58 is connected to the drain region 55 of the memory cell. An SiON film (passivation film) 59 is formed to cover the bit line 58. The amount of Si—H combination in the SiON film is set to $0.6 \times 10^{21} cm^{-3}$ or less if it is formed by means of CVD using material gases containing a gas with Si—H combination.

According to such a configuration, it is presumed that the amount of H in the BPSG film 57 and the SiON film 59 that reaches the gate oxide film ($SiO_2$) 54 of the memory cell transistor is reduced. The frequency that the combination of Si and O in the gate oxide film 54 is cut will also become reduced.

Since the frequency that the combination of Si and O in the gate oxide film 54 is cut is reduced, the variations in the threshold of the transistors due to electron traps in the gate oxide film 54 remain unchanged from those in the case where the BPSG film or SiON film is formed by means of CVD using material gases with no Si—H combination.

The moisture resistance of the BPSG film 57 and the SiON film 59 can be improved by setting the refractive index of the BPSG film 57 and the SiON film 59 to 1.65 or more. Also, the moisture resistance of the SION film 59 can be improved by setting the concentration of nitrogen in the SiON film 59 to $3 \times 10^{21} cm^{-3}$ or more.

That is, for the BPSG film 57 and the SION film 59, the percent defective in the moisture resistance test when the refractive index or the concentration of nitrogen satisfies the condition is 0%.

Next, a method of manufacturing the semiconductor device of FIGS. 7 to 9 will be described.

Figure 10:
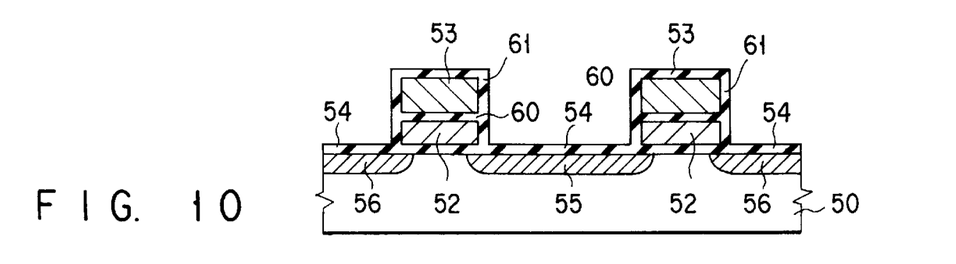
FIG. 10 is a sectional view illustrating a step in a method of manufacture of the EEPROM of FIGS. 7 to 9.
Figure 14:
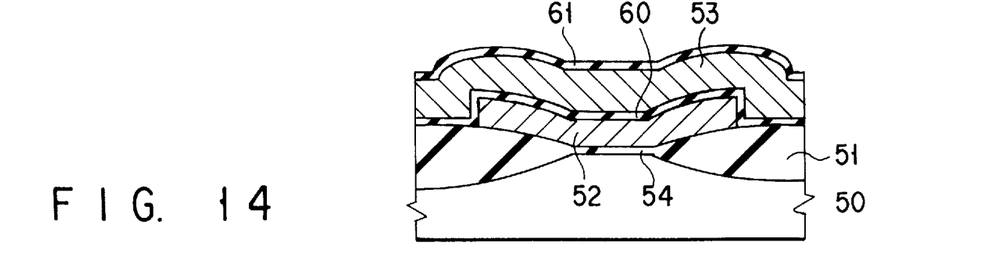
FIG. 14 is a sectional view illustrating a step in a method of manufacture of the EEPROM of FIGS. 7 to 9.

First, as shown in FIGS. 10 and 14, the surface of the P-type monocrystalline silicon substrate 50 is subjected to selective oxidation to form the field oxide film 51 of silicon oxide consisting of, for example, about 500 nm in thickness. After that, thermal oxidation is carried out to form a gate oxide film 54, consisting of silicon oxide, of, for example, about 10 nm in thickness over the device region surrounded with the field oxide film 51.

By means of CVD, a first polysilicon film is formed at a thickness of, for example, about 200 nm over the entire surface of the silicon substrate 50. The silicon substrate 50 is heated in a $POCl_3$ atmosphere to introduce impurities (phosphorous) into the first polysilicon film.

A resist pattern is formed by means of a photo-lithographic etching step and, by using the resist pattern as a mask, the first polysilicon film is partly etched by the RIE method to form openings. The openings are formed to separate the floating gate electrodes of the adjacent memory cells at a subsequent step of patterning the floating gate electrodes.

Thermal oxidation is carried out to form a silicon oxide film 60 of a thickness of, for example, about 30 nm over the surface of the first polysilicon film. By means of CVD, a second polysilicon film is then formed over the entire surface of the silicon substrate 50. The silicon substrate 50 is heated in $POCl_3$ atmosphere to thereby introduce impurities (phosphorous) into the second polysilicon film.

A silicide film is formed over the second polysilicon film. The total thickness of the second polysilicon film and the silicide film set to, for example, about 500 nm.

After that, a resist pattern is formed by means of a photolithographic etching step, and, using the resist pattern as a mask, the silicide film, the second polysilicon film and the first polysilicon film are etched by means of the RIE method. As a result, the floating and control gate electrodes 52 and 53 are formed.

Using the floating and control gate electrodes 52 and 53 as a mask, N-type impurities, such as phosphorous, are ion implanted into the silicon substrate 50. Thermal oxidation is carried out to form a silicon oxide film 61 on the floating and control gate electrodes 52 and 53 and activate the N-type impurities in the silicon substrate 50 to form drain and source regions 55 and 56.

Figure 11:
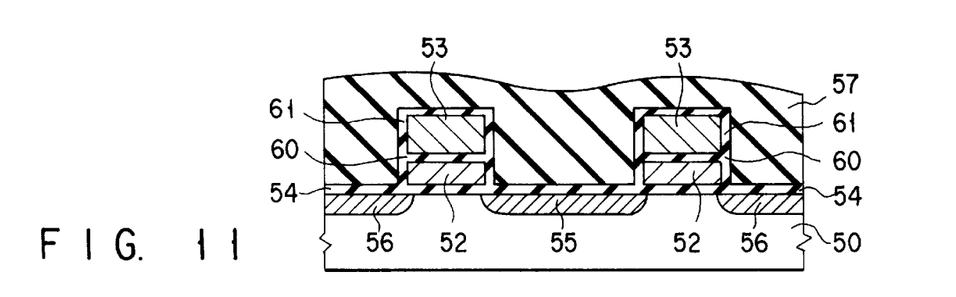
FIG. 11 is a sectional view illustrating a step in a method of manufacture of the EEPROM of FIGS. 7 to 9.
Figure 15:
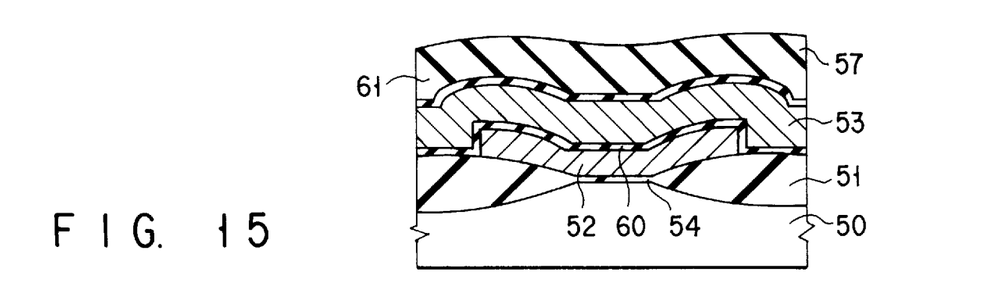
FIG. 15 is a sectional view illustrating a step in a method of manufacture of the EEPROM of FIGS. 7 to 9.

Next, as shown in FIG. 11 and 15 the BPSG film 57 is formed to coat the memory cell consisting of the floating gate electrode 52, the control gate electrode 53, the drain region 55, and the source region 56.

Heat treatment is carried out to flatten the surface of the BPSG film 57.

When the BPSG film 57 is formed by means of CVD using material gases containing a gas with Si—H combination (for example, $SiH_4$, $SiH_2Cl_2$, or the like; see Table 1), it is formed under such a condition as permits the amount of Si—H combination in the BPSG film to become $0.6 \times 10^{21} cm^{-3}$ or less.

Figure 12:
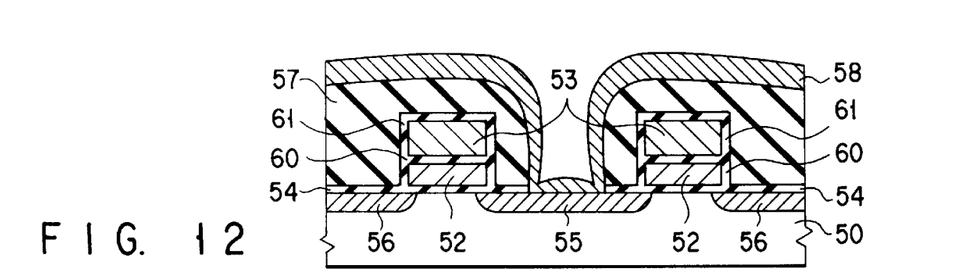
FIG. 12 is a sectional view illustrating a step in a method of manufacture of the EEPROM of FIGS. 7 to 9.
Figure 16:
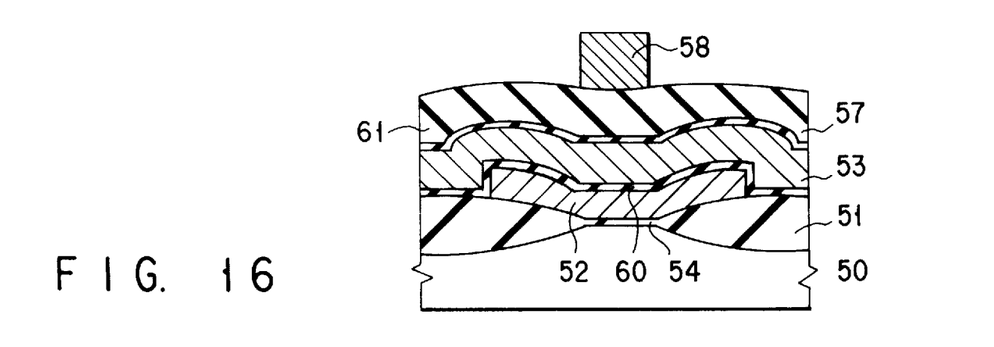
FIG. 16 is a sectional view illustrating a step in a method of manufacture of the EEPROM of FIGS. 7 to 9.

Next, as shown in FIGS. 12 and 16, a photo-lithographic etching step is carried out to form a resist pattern, and, using this resist pattern as a mask, the BPSG film 57 is etched by means of the RIE method to form a contact hole that reaches the drain region 55.

After that, by means of sputtering, a metal film, e.g., an aluminum alloy film of a thickness of, for example, about 800 nm is formed on the BPSG film 57.

A resist pattern is formed by means of a photolithographic etching step and, using this resist pattern as a mask, the metal film is etched by means of the RIE method to thereby form the bit line 58.

Figure 13:
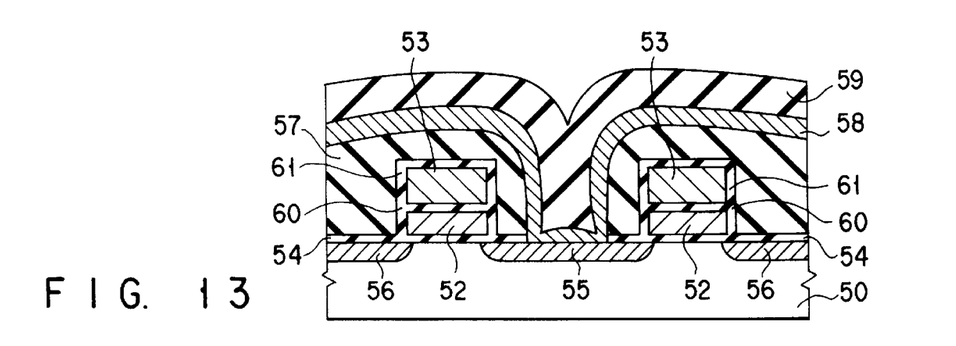
FIG. 13 is a sectional view illustrating a step in a method of manufacture of the EEPROM of FIGS. 7 to 9.
Figure 17:
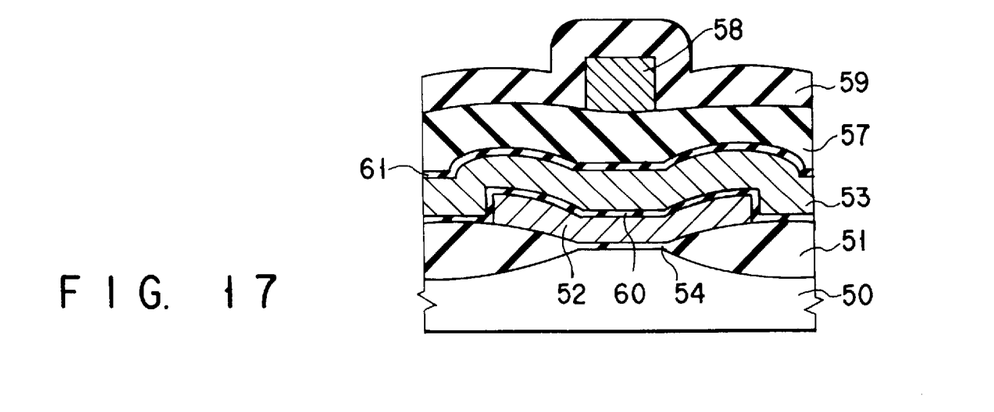
FIG. 17 is a sectional view illustrating a step in a method of manufacture of the EEPROM of FIGS. 7 to 9.

Next, as shown in FIGS. 13 and 17, the SiON film (passivation film) 59 is formed in a plasma atmosphere using gases of $SiH_4$, $N_2O$, $NH_3$, $N_2$ with the substrate temperature set at about 400° C. and the frequency set at about 13.56 MHz by way of example.

Here, the SiON film is formed so that the amount of Si—H combination in it becomes $0.6 \times 10^{21} cm^{-3}$ or less by controlling the flow rate of $SiH_4$ or $N_2O$.

In the above steps, by setting the refractive index of the BPSG film 57 or the SiON film 59 to 1.65 or more or by setting the concentration of nitrogen in the SiON film 59 to $3 \times 10^{21} cm^{-3}$ or more, the moisture resistance of the BPSG film 57 or the SiON film 59 can be improved.

According to the above steps, an improvement in moisture resistance and a reduction in electron traps can be achieved with the passivation film consisting of the SiON film 59 only. Thus, the number of steps required can be reduced and the manufacturing cost can be decreased as compared with the use of a stacked layer of, for example, a plasma SiN film (upper layer) having a good moisture resistance and a plasma TEOS film (lower layer) having little Si—H combination.

Here, the plasma SiN film refers to an SiN film formed by means of plasma CVD using a gas having Si—H combination. The plasma TEOS film refers to a silicon oxide film formed by means of plasma CVD using a gas, an $O_2$ gas.

The SiON film formed by plasma CVD is superior in step coverage on a metallization pattern of aluminum or aluminum alloy to a stacked layer of a TEOS film and an SiN film formed by means of plasma CVD.

Figure 18:
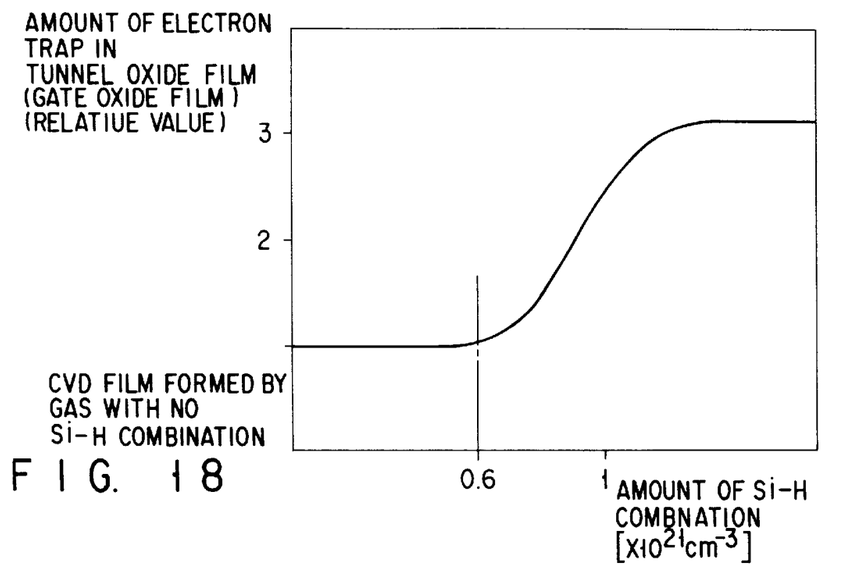
FIG. 18 shows a relationship between the amount of Si—H combination and the amount of electron trap in a gate oxide film.

For a semiconductor device (LSI) using an insulating film formed by means of CVD (atmospheric pressure, low pressure, plasma) using material gases including a gas having Si—H combination, FIG. 18 shows a relationship between the amount of Si—H combination in that insulating film and the amount of electron trap in the gate oxide film of MOS transistors formed in the semiconductor device.

According to the results of this experiment, when the amount of Si—H combination in the insulating film is $0.6 \times 10^{21} cm^{-3}$, the amount of electron trap in the MOS transistors was substantially the same as that in a semiconductor device having only insulating films formed by means of CVD using a gas with no Si—H combination (the relative ratio is unity).

The calculation of the amount of Si—H combination can be performed on the basis of FT-IR.

Figure 19:
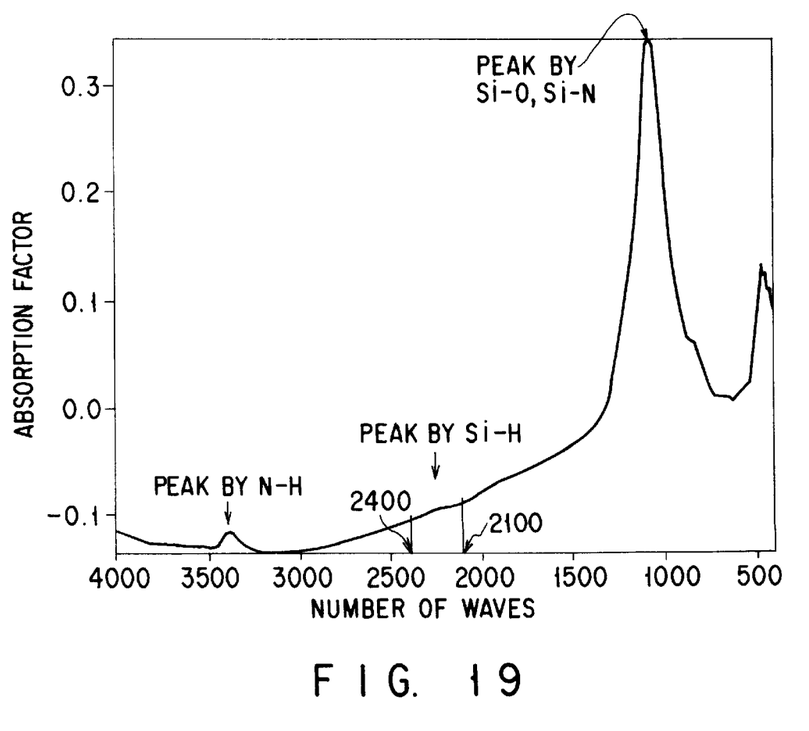
FIG. 19 shows an FT-IR spectrum of an insulating film.

FIG. 19 shows the results of measurement of a plasma SiON film by FT-IR. The peak absorption area of Si—H combination was set to a region of 2400 to 2100 $cm^{-1}$. For conversion from peak absorption area to density value, a method described in, for example, J.Appl. Phys. 49, p 2473 (1978) can be used.

Here, the plasma SION film refers to silicon oxynitride formed by means of plasma CVD using an $SiH_4$ gas, an $N_2$ gas, an $NH_3$, an $N_2$ gas.

The refractive index of an insulating film formed by means of CVD (atmospheric pressure, low pressure, plasma) using material gases containing a gas with Si—H combination can be measured by the method using an He-Ne laser (632.8 nm) as a light source.

The measurement of the refractive index of oxide is described in Refractive index and stress in 6.4.5 Properties of Silicon Dioxide, VLSI Technology (2nd EDIT), p 260 (1988).

Figure 20A:
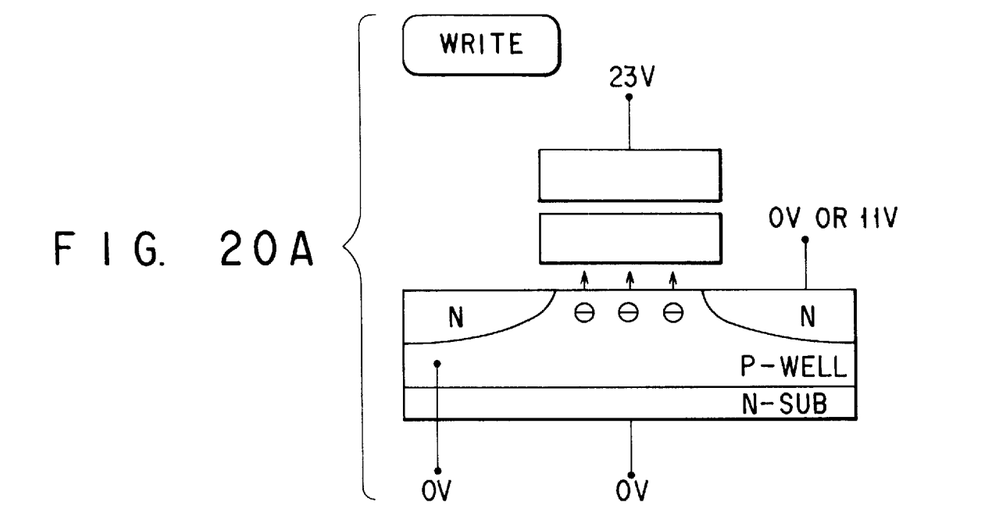
FIGS. 20A–20B show the manner in which electrons moves in the EEPROM.
Figure 20B:
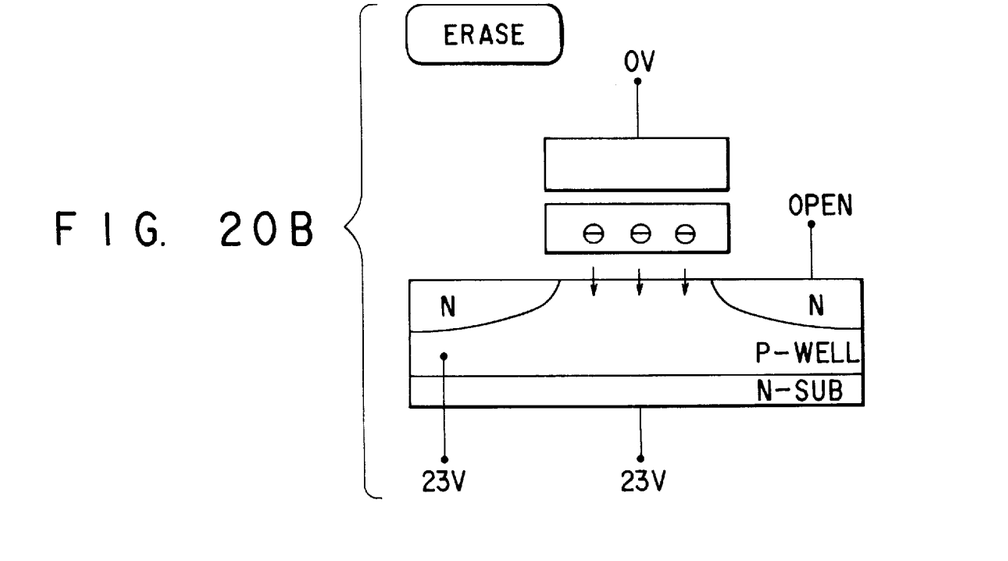
Figure 21:
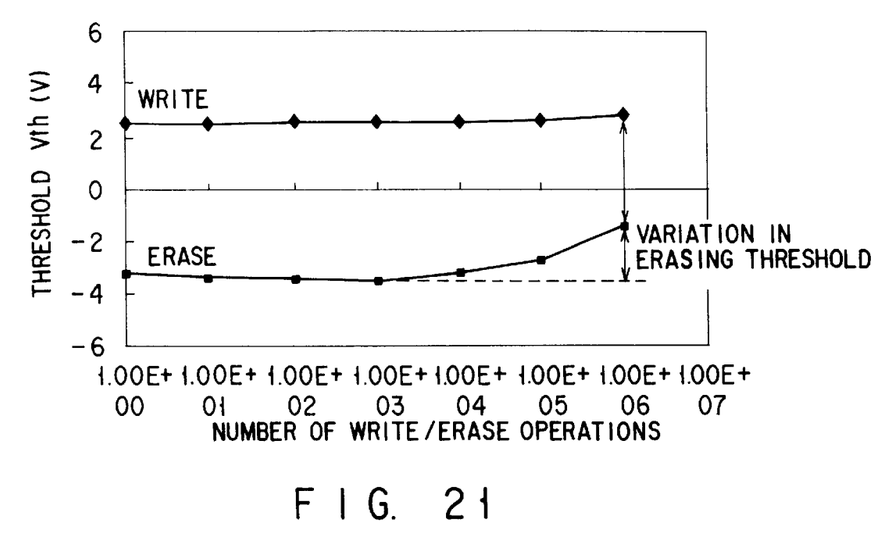
FIG. 21 shows a relationship between the number of times write and erase operations are formed and variations in he threshold of transistors.

FIGS. 20 and 21 show the mechanism by which electron traps are produced in the gate oxide film (tunnel oxide film)

of a transistor forming a memory cell in a NAND type of EEPROM by way of example.

That is, as shown in FIG. 20, the writing and erasing of data in the NAND type of EEPROM are performed by electrons moving between the substrate (well) and the floating gate. That is to say, electron traps are easy to form in the tunnel oxide film serving as the passage of electrons and, particularly when an insulating film of which the amount of Si—H combination exceeds $0.6 \times 10^{21} \text{cm}^{-3}$ is used as the passivation film, the formation of electron traps is promoted. As shown in FIG. 21, variations in threshold seem to become remarkable as the numbers of writing and erasing operations increase.

Next, a method of manufacturing an insulating film (interlayer insulating film, passivation film) according to the present invention will be described.

Figure 22:
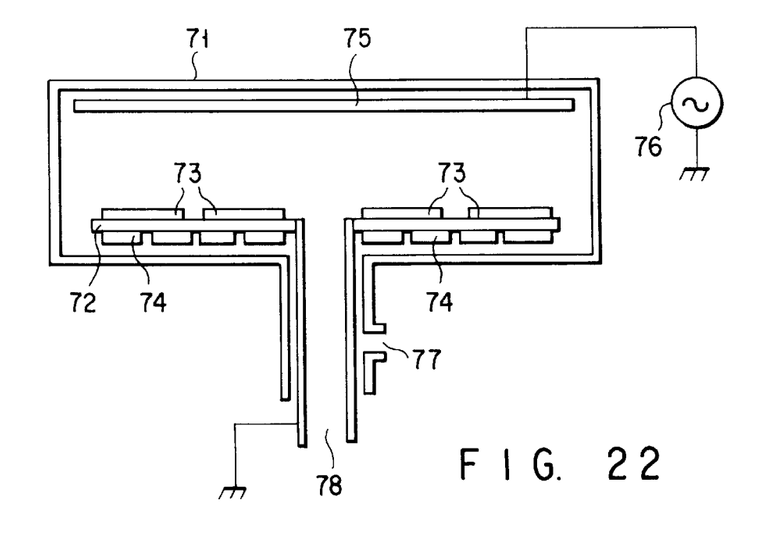
FIG. 22 shows an exemplary plasma CVD apparatus.

FIG. 22 shows an example of a CVD apparatus for use with the method of manufacturing an insulating film according to the present invention.

The CVD apparatus is a parallel flat plate type of plasma CVD apparatus.

Inside a chamber 71 is placed a lower electrode 72 on which wafers are placed. A number of wavers 73 are placed on the lower electrode 72. Under the lower electrode 72 are mounted heaters 74 that maintains the wafers 73 at a predetermined temperature during CVD process. The lower electrode 72 is connected to ground potential.

Over the lower electrode 72 an upper electrode 75 is placed to face the lower electrode 72. The upper electrode 75 is connected to a radio frequency power supply 76.

The chamber 71 is equipped with a gas inlet for introducing a material gas and a gas outlet 78 for discharging a gas after reaction.

Figure 23:
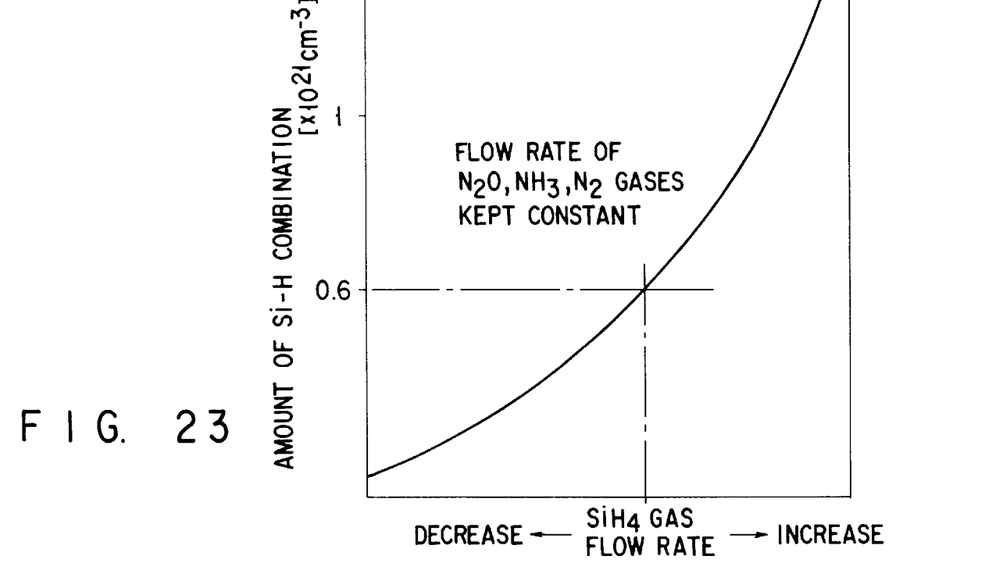
FIG. 23 shows a relationship between the flow rate of an $SiH_4$ gas and the amount of Si—H combination in a CVD film.

FIG. 23 shows a relationship between the flow rate of $SiH_4$ gas and the amount of Si—H combination in the P-CVD film when $SiH_4$, $N_2O$, $NH_3$, $N_2$ are used as material gases.

In this experiment, the plasma CVD apparatus shown in FIG. 22 was used, the wafer temperature at the time of P-CVD film formation was set at 400° C., and the frequency of the radio frequency power supply was set at 13.56 MHz. The flow rate of each of the $N_2O$ gas, the $NH_3$ and the $N_2$ gas was kept constant.

From this graph, it can be seen that the amount of Si—H combination in the P-CVD film can be adjusted by changing the flow rate of the $SiH_4$ gas.

Therefore, a P-CVD film of which the amount of Si—H combination is $0.6 \times 10^{21} \text{cm}^{-3}$ can be formed by changing the flow rate of $SiH_4$ gas with the flow rate of the $N_2O$ gas, $NH_3$ gas, $N_2$ kept constant.

Figure 24:
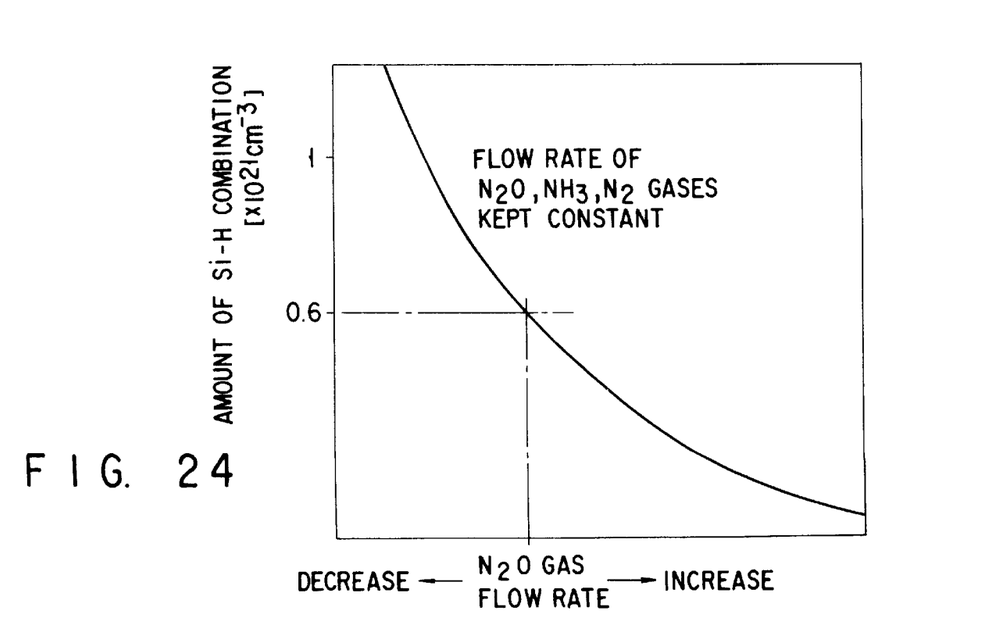
FIG. 24 shows a relationship between the flow rate of an $N_2O$ gas and the amount of Si—H combination in a CVD film.

FIG. 24 shows a relationship between the flow rate of $N_2O$ gas and the amount of Si—H combination in a P-CVD film when $SiH_4$, $N_2O$, $NH_3$, $N_2$ are used as material gases.

In this experiment, the plasma CVD apparatus shown in FIG. 22 was used, the wafer temperature at the time of P-CVD film formation was set at 400° C., and the frequency of the radio frequency power supply was set at 13.56 MHz. The flow rate of each of the $SiH_4$ gas, the $NH_3$ and the $N_2$ gas was kept constant.

From this graph, it can be seen that the amount of Si—H combination in the P-CVD film can be adjusted by changing the flow rate of the $N_2O$ gas.

Therefore, a P-CVD film of which the amount of Si—H combination is $0.6 \times 10^{21} \text{cm}^{-3}$ can be formed by changing the flow rate of $N_2O$ gas with the flow rate of the $SiH_3$ gas, $NH_3$ gas, $N_2$ kept constant.

Figure 25:
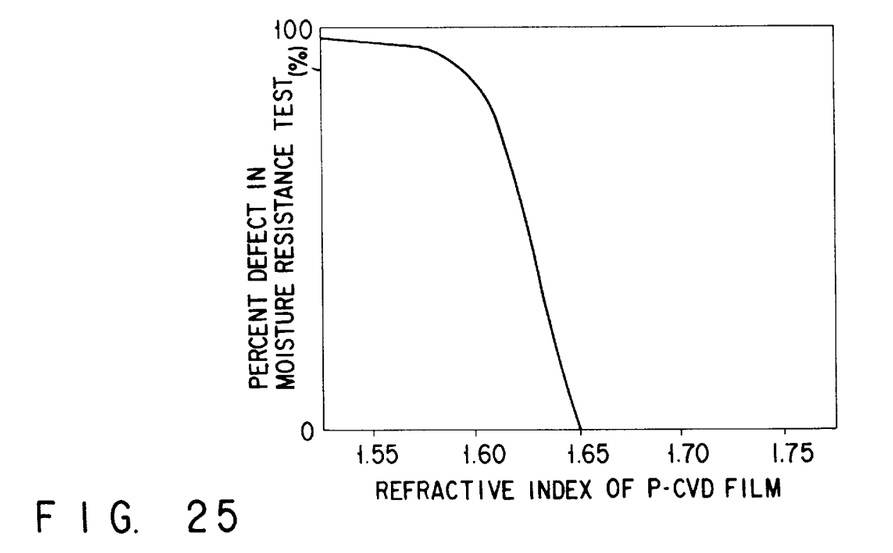
FIG. 25 shows a relationship between the refractive index and the moisture resistance of a CVD film.
Figure 26:
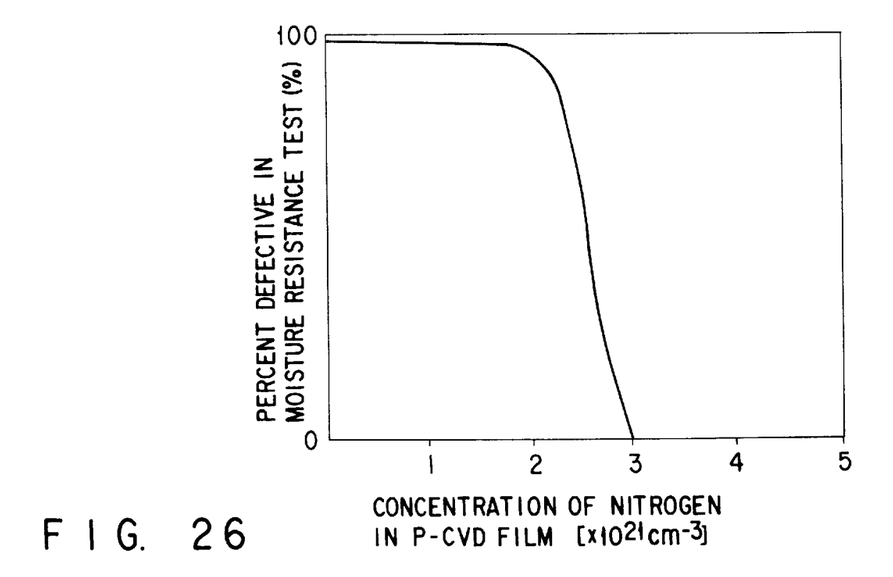
FIG. 26 shows a relationship between the concentration of nitrogen and the moisture resistance of a CVD film.

FIG. 25 shows a relationship between the refractive index of a P-CVD film and the percent defect in moisture resistance test. FIG. 26 shows a relationship between the concentration of nitrogen in a P-CVD film and the percent defect in moisture resistance test.

According to this graph, the percent defect in moisture resistance test can be made 0% by setting the refractive index of the P-CVD film to 1.65 or more. The percent defect in moisture resistance test can also be made 0% by setting the concentration of nitrogen in the P-CVD film to $3 \times 10^{21} \text{cm}^3$ or more.

Therefore, when use is made of a P-CVD film of which the amount of Si—H combination is $0.6 \times 10^{21} \text{cm}^{-3}$ or less, a semiconductor device in which the amount of electron trap in the gate oxide film is reduced and the moisture resistance is good can be provided by further setting the refractive index of the P-CVD film to 1.65 or more or the concentration of nitrogen in the P-CVD film to $3 \times 10^{21} \text{cm}^{-3}$ or more.

As described above, a semiconductor device using an insulating film according to the present invention provides the following advantages.

In forming a CVD film using material gases containing a gas with Si—H combination, by setting the amount of Si—H combination in the CVD film (interlayer insulating film or passivation film) to $0.6 \times 10^{21} \text{cm}^{-3}$ or less, hydrogen (H) is almost prevented from reaching the gate oxide film or tunnel oxide film of transistors during or after the CVD film formation.

Thus, the frequency that the combination of atoms in the gate oxide film or tunnel oxide film is cut is reduced and the formation of the amount of electron trap in the gate oxide film or tunnel oxide film can be suppressed.

In manufacturing a CVD film using a material gas containing a gas with Si—H combination, by setting the refractive index of the CVD film to 1.65 or more or by setting the concentration of nitrogen in the CVD film to $3 \times 10^2 \text{cm}^{-3}$ or more, the moisture resistance can be improved.

Thus, moisture will not reach metal lines, such as aluminum, after the completion of the semiconductor device, permitting the reliability of the semiconductor device to be improved.

INDUSTRIAL APPLICABILITY

As described above, an insulating film of the present invention is useful for use in a semiconductor device, such as a MOS transistor, which needs improvements in device characteristics and moisture resistance.

What is claimed is:

1. A semiconductor device having an insulating film that is formed by means of CVD using material gases containing a gas having Si—H combination, characterized in that the amount of Si—H combination in the insulating film is $0.6 \times 10^{21} \text{cm}^{-3}$ or less and wherein a concentration of nitrogen in the insulating film is $3 \times 10^{21} \text{cm}^{-3}$ or more.

2. The device according to claim 1, wherein the insulating layer is an interlayer insulating film or passivation film.

3. The device according to claim 1, wherein the insulating film is placed at least on metal interconnection lines.

4. The device according to claim 1, wherein the insulating film is one that is formed by means of plasma CVD.

5. The device according to claim 1, wherein the insulating film is one selected from an $SiO_2$ film, a PSG film, a BSG film, an ASG film, a BPSG film, a GSG film, an $Si_3N_4$, and an SiOxNy film.

6. The device according to claim 1, wherein the refractive index of the insulating film is 1.65 or more.

7. In a semiconductor device having a passivation film and a wafer coated with the passivation film, the passivation film is formed by CVD using material gases containing a gas having Si—H combination, the amount of Si—H combination in the passivation film is $0.6 \times 10^{21} cm^{-3}$ or less and wherein the passivation film has a nitrogen concentration of $3 \times 10^{21} cm^{-3}$ or more.

8. The device according to claim 7 wherein the refractive index of the passivation film is 1.65 or more.

9. In a semiconductor device having a passivation film and a semiconductor chip coated with the passivation film, the passivation film is formed by means of CVD using material gases containing a gas having Si—H combination, and the amount of Si—H combination in the passivation film is $0.6 \times 10^{21} cm^{-3}$ or less and wherein the passivation film has a nitrogen concentration of $3 \times 10^{21} cm^{-3}$ or more.

10. The device according to claim 9, wherein the refractive index of the passivation film is 1.65 or more.

11. In a memory device having a semiconductor substrate, memory cells formed on the semiconductor substrate, and an insulting film formed over the memory cells, the insulating film is formed by means of CVD using material gases containing a gas having Si—H combination, and the amount of Si—H combination in the insulating film is $0.6 \times 10^{21} cm^{-3}$ or less and wherein the insulating film has a nitrogen concentration of $3 \times 10^{21} cm^{-3}$ or more.

12. The device according to claim 11, wherein the insulating layer is an interlayer insulating film or passivation film.

13. The device according to claim 11, wherein the insulating film is placed at least on metal interconnection lines.

14. The device according to claim 11, wherein the insulating film is one that is formed by means of plasma CVD.

15. The device according to claim 11, wherein the insulating film is one selected from an $SiO_2$ film, a PSG film, a BSG film, an ASG film, a BPSG film, a GSG film, an $Si_3N_4$, and an SiOxNy film.

16. The device according to claim 11, wherein the memory cells are ones of a DRAM.

17. The device according to claim 11, wherein the memory cells are ones of an EEPROM.

18. The device according to claim 11, wherein the refractive index of the insulating film is 1.65 or more.

19. In a memory device having a semiconductor substrate, MOS transistors formed on the semiconductor substrate, and an insulating film formed over the MOS transistors the insulating film is formed by means of CVD using material gases containing a gas having Si—H combination, and the amount of Si—H combination in the insulating film is $0.6 \times 10^{21} cm^{-3}$ or less and wherein the insulating film has a nitrogen concentration of $3 \times 10^{21} cm^{-3}$ or more.

20. The device according to claim 19, wherein the insulating layer is an interlayer insulating film or passivation film.

21. The device according to claim 19, wherein the insulating film is placed at least on metal interconnection lines.

22. The device according to claim 19, wherein the insulating film is one that is formed by means of plasma CVD.

23. The device according to claim 19, wherein the insulating film is one selected from an $SiO_2$ film, a PSG film, a BSG film, an ASG film, a BPSG film, a GSG film, an $Si_3N_4$, and an SiOxNy film.

24. The device according to claim 19, wherein the refractive index of the insulating film is 1.65 or more.

25. In a method of forming an insulating film by means of CVD using material gases containing a gas having Si—H combination, the flow rate of the gas having Si—H combination is regulated so that the amount of Si—H combination in the insulating film becomes $0.6 \times 10^{21} cm^{-3}$ and wherein the insulating film has a nitrogen concentration of $3 \times 10^{21} cm^{-3}$ or more.

26. The method according to claim 25, wherein the insulating film is formed by means of plasma CVD.

27. In a method of forming an insulating film by means of CVD using material gases containing a gas having Si—H combination, the flow rate of a gas other than the gas having Si—H combination is regulated so that the amount of Si—H combination in the insulating film becomes $0.6 \times 10^{21} cm^{-3}$ and wherein the insulating film has a nitrogen concentration of $3 \times 10^{21} cm^{-3}$ or more.

28. The method according to claim 27, wherein the insulating film is formed by means of plasma CVD.

* * * * *

UNITED STATES PATENT AND TRADEMARK OFFICE
CERTIFICATE OF CORRECTION

PATENT NO.    : 6,100,579
DATED         : August 8, 2000
INVENTOR(S)   : Masahisa Sonada et al.

It is certified that error appears in the above-identified patent and that said Letters Patent is hereby corrected as shown below:

Claim 8, col. 13, line 10, after "claim 7", insert --,--.

Claim 11, col. 13, line 23, "insulting film" should read
    --insulating film--.

Claim 19, col. 14, line 5, after "transistors", insert --,--.

Signed and Sealed this

Fifteenth Day of May, 2001

*Attest:*

NICHOLAS P. GODICI

*Attesting Officer*    *Acting Director of the United States Patent and Trademark Office*